United States Patent
Kobayashi et al.

(10) Patent No.: US 11,322,676 B2
(45) Date of Patent: May 3, 2022

(54) MULTILAYER ULTRASONIC TRANSDUCER AND ULTRASONIC INSPECTION DEVICE

(71) Applicant: KABUSHIKI KAISHA TOSHIBA, Minato-ku (JP)

(72) Inventors: Tsuyoshi Kobayashi, Kawasaki (JP); Noriko Yamamoto, Yokohama (JP); Yasuharu Hosono, Kawasaki (JP); Mitsunaga Saito, Inzai (JP); Kazuhiro Itsumi, Koto (JP); Akiko Hirao, Kawasaki (JP); Tomio Ono, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 902 days.

(21) Appl. No.: 16/131,588

(22) Filed: Sep. 14, 2018

(65) Prior Publication Data

US 2019/0296215 A1  Sep. 26, 2019

(30) Foreign Application Priority Data

Mar. 22, 2018  (JP) .............................. JP2018-054092

(51) Int. Cl.
*H01L 41/047* (2006.01)
*B06B 1/02* (2006.01)
(Continued)

(52) U.S. Cl.
CPC ........ *H01L 41/0471* (2013.01); *B06B 1/0215* (2013.01); *B06B 1/0644* (2013.01);
(Continued)

(58) Field of Classification Search
CPC ............... H01L 41/0471; H01L 41/042; H01L 41/0472; H01L 41/0825; H01L 41/297; H01L 41/083; B06B 1/0644
See application file for complete search history.

(56) References Cited

U.S. PATENT DOCUMENTS 6,333,590 B1    12/2001  Izumi
2006/0067029 A1*  3/2006  Kuniyasu .............. H01L 41/083
                                                          361/302
(Continued)

FOREIGN PATENT DOCUMENTS

EP    0 641 606 A2    3/1995
JP    5-038335        2/1993
(Continued)

*Primary Examiner* — Bryan P Gordon
(74) *Attorney, Agent, or Firm* — Oblon, McClelland, Maier & Neustadt, L.L.P.

(57) ABSTRACT

A multilayer ultrasonic transducer of an embodiment includes: a plurality of stacked oscillators; external electrodes disposed on outer exposed surfaces of two oscillators disposed in the outermost layers out of the plurality of oscillators; and a plurality of internal electrodes each disposed between two of the plurality of oscillators. There are provided electrode regions in which the plurality of internal electrodes are arranged such that the number of layers of the internal electrodes in a direction in which the oscillators are stacked gradiently increases from an inner region toward an outer peripheral region of the plurality of oscillators, and ultrasonic waves emitted from the plurality of oscillators are focused toward at least the inner region.

3 Claims, 11 Drawing Sheets

(51) Int. Cl.
  *B06B 1/06*    (2006.01)
  *H01L 41/04*   (2006.01)
  *G01N 29/24*   (2006.01)
  *H01L 41/08*   (2006.01)
  *H01L 41/293*  (2013.01)
  *H01L 41/297*  (2013.01)
  *H01L 41/27*   (2013.01)
  *H01L 41/083*  (2006.01)

(52) U.S. Cl.
  CPC ......... *G01N 29/245* (2013.01); *H01L 41/042* (2013.01); *H01L 41/0472* (2013.01); *H01L 41/083* (2013.01); *H01L 41/0825* (2013.01); *H01L 41/27* (2013.01); *H01L 41/293* (2013.01); *H01L 41/297* (2013.01)

(56) References Cited

U.S. PATENT DOCUMENTS

| | | | | |
|---|---|---|---|---|
| 2008/0222866 | A1* | 9/2008 | Miyoshi | H01L 41/27 29/25.35 |
| 2009/0200898 | A1* | 8/2009 | Sakaki | H01L 41/1876 310/358 |
| 2010/0237751 | A1* | 9/2010 | Bosch | H01L 41/0471 310/366 |
| 2013/0002092 | A1* | 1/2013 | Suzuki | H01G 4/30 310/311 |
| 2013/0241361 | A1* | 9/2013 | Lee | H01G 4/012 310/366 |
| 2013/0278681 | A1* | 10/2013 | Saito | H02N 2/163 347/68 |
| 2017/0263846 | A1* | 9/2017 | Nakamura | A61B 8/4483 |

FOREIGN PATENT DOCUMENTS

| | | |
|---|---|---|
| JP | 7-107595 | 4/1995 |
| JP | 11-273078 | 10/1999 |
| JP | 2000-088822 | 3/2000 |
| JP | 2003-009288 | 1/2003 |
| JP | 2008-066972 | 3/2008 |
| JP | 2009-194226 | 8/2009 |

\* cited by examiner

FOCUSING

MULTILAYER ULTRASONIC TRANSDUCER AND ULTRASONIC INSPECTION DEVICE

CROSS REFERENCE TO RELATED APPLICATION

This application is based upon and claims the benefit of priority from Japanese Patent Application No. 2018-054092, filed on Mar. 22, 2018; the entire contents of which are incorporated herein by reference.

FIELD

Embodiments described herein relate generally to a multilayer ultrasonic transducer and an ultrasonic inspection device.

BACKGROUND

Ultrasonic inspection devices are used for medical diagnosis and non-destructive inspection of various members, devices, and so on. An ultrasonic inspection device includes, for example: an ultrasonic transducer which irradiates an inspection target part with an ultrasonic wave and receives a reflected wave from the inspection target part; and a control part which performs inspection processing of a state of the inspection target part based on the reflected wave from the ultrasonic transducer. An ultrasonic transducer is typically a device that includes electrodes disposed on both surfaces of an oscillator made of a piezoelectric material and emits an ultrasonic wave by applying a voltage (electric field) to the oscillator from the two electrodes. When the ultrasonic waves emitted from the ultrasonic transducer are to be focused, an acoustic lens is pasted on an ultrasonic wave transmitting/receiving surface of the ultrasonic transducer to focus the ultrasonic waves. This has disadvantages of the complication of the structure of the device, leading to low reliability, an increased manufacturing cost, and so on. Further, since the number of bonded interfaces increases, the ultrasonic wave is reflected on the interfaces and the ultrasonic wave is attenuated in the lens, which is likely to decrease the sensitivity and resolution of the ultrasonic transducer.

As an ultrasonic transducer, one having a multilayer structure is known. Specifically, there is known a multilayer ultrasonic transducer in which internal electrodes are each disposed between two of a plurality of stacked oscillators and these oscillators and the internal electrodes are integrated. In a conventional multilayer ultrasonic transducer, the internal electrodes provided between the oscillators are different in shape, and regions having different numbers of driven oscillators are provided in an oscillation region. The conventional multilayer ultrasonic transducer, however, is intended to inhibit the occurrence of a side lobe and to widen a frequency band of the ultrasonic wave (band broadening), and for these purposes, the oscillation region has a larger number of layers of the internal electrodes as it goes more inward, and has a smaller number of layers of the internal electrodes as it goes more outward. In such a conventional multilayer ultrasonic transducer, no consideration is given to the focusing of the ultrasonic waves.

DETAILED DESCRIPTION

A multilayer ultrasonic transducer of an embodiment includes: a plurality of stacked oscillator layers; external electrode layers disposed on outer exposed surfaces of two oscillator layers positioned in outermost layers out of the stacked oscillator layers; and a plurality of internal electrode layers each disposed between two of the stacked oscillator layers. The multilayer ultrasonic transducer of the embodiment provides electrode regions in which the plurality of internal electrode layers are arranged such that the number of the internal electrode layers in a direction in which the oscillator layers are stacked increases from an inner region toward an outer peripheral region of the stacked oscillator layers, and ultrasonic waves emitted from the stacked oscillator layers are focused toward at least the inner region.

Multilayer ultrasonic transducers of embodiments and an ultrasonic inspection device will be hereinafter described with reference to the drawings. Note that, in the embodiments, substantially the same constituent parts are denoted by the same reference signs and a description thereof may be partly skipped. The drawings are schematic, and a relation of thickness and planar dimension of each part, a thickness ratio among parts, and so on may be different from actual ones. Terms indicating the up and down directions may differ from actual directions based on a gravitational acceleration direction.

First Embodiment

Figure 1:
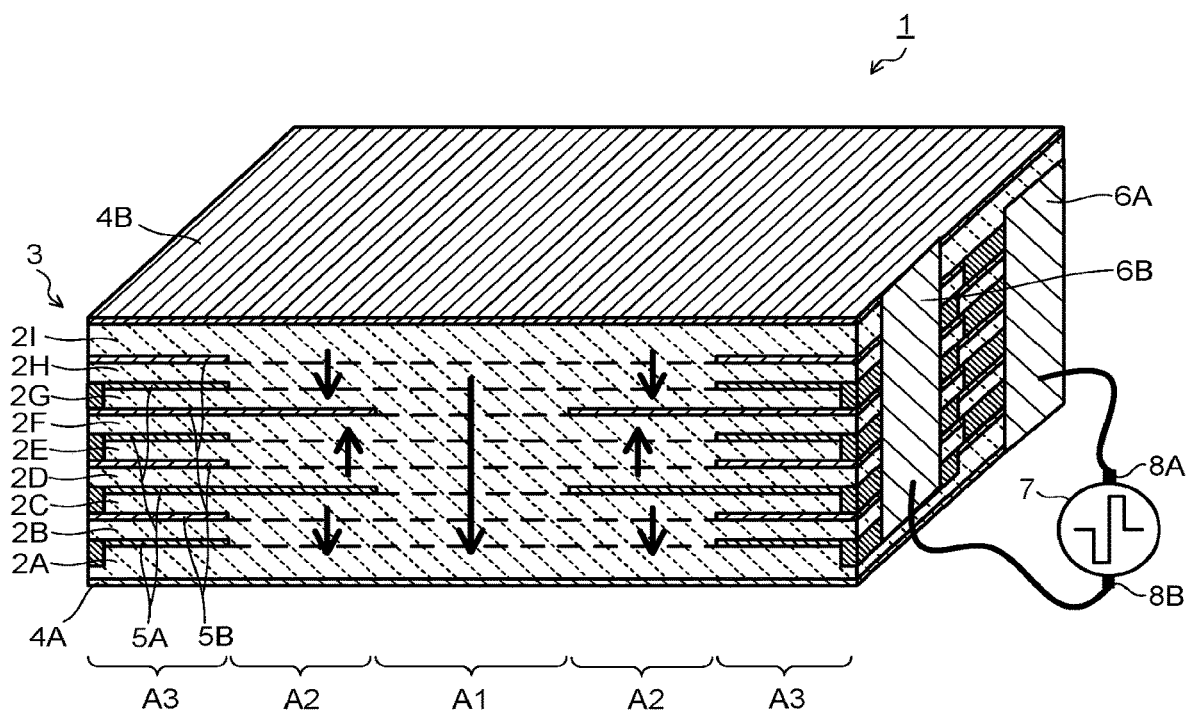
FIG. 1 is a perspective view illustrating a multilayer ultrasonic transducer of a first embodiment.

FIG. 1 is a perspective view illustrating a multilayer ultrasonic transducer of a first embodiment. The multilayer ultrasonic transducer 1 illustrated in FIG. 1 includes a multilayer oscillator 3 having a plurality of stacked oscillators (also referred to as stacked oscillator layers) 2. The multilayer oscillator 3 illustrated in FIG. 1 has nine layers of oscillators (also referred to as oscillator layers) 2A, 2B . . . 2I stacked in sequence. On outer exposed surfaces of the two oscillators 2A, 2I disposed in the outermost layers of the multilayer oscillator 3, external electrodes (also referred to as external electrode layers) 4 are provided. Specifically, a first external electrode 4A is provided on a lower surface of the oscillator 2A, and a second external electrode 4B is provided on an upper surface of the oscillator 2I.

Inside the multilayer oscillator 3, internal electrodes (also referred to as internal electrode layers) 5 are provided. The internal electrodes 5 are each provided between adjacent oscillators 2 out of the stacked oscillators 2A to 2I. Specifically, a first internal electrode 5A facing the first external electrode 4A is provided between the oscillator 2A and the oscillator 2B. A second internal electrode 5B facing the first internal electrode 5A is provided between the oscillator 2B and the oscillator 2C. Likewise, first internal electrodes 5A and second internal electrodes 5B are alternately provided, each between adjacent ones of the oscillators 2C to 2H. Between the oscillator 2H and the oscillator 2I, a second internal electrode 5B facing the second external electrode 4B is provided. Between a pair and between an adjacent pair out of the oscillators 2A to 2I, the first internal electrode 5A and the second internal electrode 5B are disposed respectively, to face each other.

The first and second external electrodes 4A, 4B function as common electrodes. The first external electrode 4A and the second internal electrodes 5B are connected to a first connection terminal 6A provided on one side surface of the multilayer oscillator 3. The second external electrode 4B and the first internal electrodes 5A are connected to a second connection terminal 6B provided on the other of side surface of the multilayer oscillator 3. The first connection terminal 6A is connected to a first terminal 8A of a power source 7. The second connection terminal 6A is connected to a second terminal 8B of the power source 7. Here, the power source 7 is, for example, a pulser power source which drives the transducer 1 by a pulse wave, a rectangular wave, a burst wave, or the like to cause the transducer 1 to generate an ultrasonic wave. When a voltage is applied to the external electrodes 4A, 4B and the internal electrodes 5A, 5B of the multilayer oscillator 3 from the power source 7, field effects in opposite directions are applied to adjacent ones of the oscillators 2A to 2I, causing the displacement of the oscillators 2A to 2I. This can increase a sound pressure of the ultrasonic wave radiated from the multilayer oscillator 3.

In the multilayer ultrasonic transducer 1 of the first embodiment, formation regions of the internal electrodes 5A, 5B of the multilayer oscillator 3 are different among interlayer spaces of the oscillators 2A to 2I. In FIG. 1, regions A1 to A3 are regions illustrated for the distinction of the formation ranges of the internal electrodes 5A, 5B. The region A1 is an inner region (central region) of the multilayer oscillator 3, the regions A2 are intermediate regions extending outward from the region A1, and the regions A3 are outer peripheral regions extending outward from the regions A2. The outer peripheral regions A3 are regions provided along two opposed sides of the rectangular multilayer oscillator 3 respectively, and the intermediate regions A2 and the inner region A1 are provided in sequence on inner sides of the outer peripheral regions A3.

The inner region A1 does not have the internal electrodes 5A, 5B. Accordingly, a voltage (electric field) is applied to nine layers of the oscillators 2A to 2I present in the inner region A1 only from the first external electrode 4A and the second external electrode 4B. Seemingly, the inner region A1 has one layer of the oscillator 2 sandwiched between the external electrode 4A and the external electrode 4B. The first internal electrodes 5A provided between the oscillator 2C and the oscillator 2D and the second internal electrodes 5B provided between the oscillator 2F and the oscillator 2G are provided all through the outer peripheral regions 3A and the intermediate regions A2. Accordingly, in each of the intermediate regions A2, a voltage (electric field) is applied to the oscillators 2 each consisting of three layers from the external electrodes 4 and the internal electrodes 5. Seemingly, the intermediate regions A2 each have three layers of the oscillators 2 sandwiched by the electrodes 4, 5. In the outer peripheral regions A3, the first and second internal electrodes 4, 5 are provided in sequence, each between two of nine layers of the oscillators 2A to 2I. Accordingly, in the outer peripheral regions A3, a voltage (electric field) is applied to the oscillators 2 from the external electrodes 4 and the internal electrodes 5. The outer peripheral regions A3 each have nine layers of the oscillators 2 sandwiched by the electrodes 4, 5.

As described above, in the multilayer ultrasonic transducer 1 of the first embodiment, the internal electrodes 5 of the multilayer oscillator 3 are arranged such that the number of layers of the internal electrodes 5 in the stacking direction of the oscillators 2 gradiently increases from the inner region A1 toward the outer peripheral regions A3. In the multilayer ultrasonic transducer 1 illustrated in FIG. 1, the number of layers of the internal electrodes 5 gradiently increases from the inner region A1 toward the outer peripheral regions A3 in order of 0, 2, and 8. Here, the sound pressure of the ultrasonic wave radiated from the oscillator 2 is higher as the thickness of the oscillator 2 present between the opposed electrodes (4, 5) is thinner. Further, in the multilayer oscillator 3, as the number of unit oscillator structures present in the radiation direction of the ultrasonic wave (the stacking direction of the oscillators 2) is larger, that is, as the number of structures in each of which the oscillator 2 is sandwiched by the opposed electrodes (4, 5) is larger, the sound pressure of the ultrasonic wave is higher. Such a gradient arrangement of the internal electrodes 5 causes differences in driving electric field, displacement amount, and driving power among the regions A1, A2, A3. That is, the regions A1, A2, A3 are driven by different electric fields.

Figure 2:
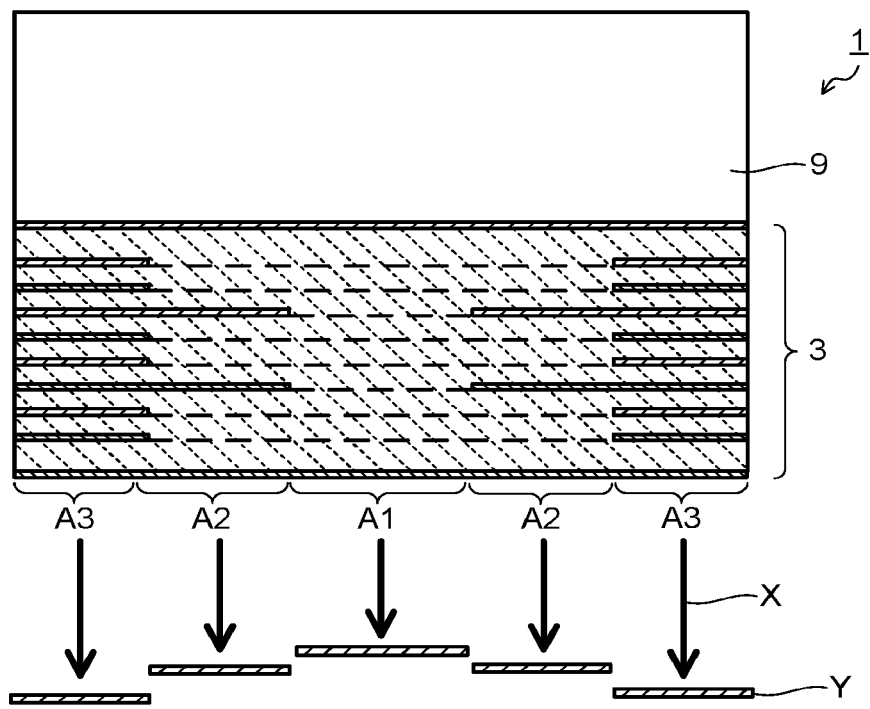
FIG. 2 is a view illustrating a state of ultrasonic waves radiated from the multilayer ultrasonic transducer illustrated in FIG. 1.
Figure 2:
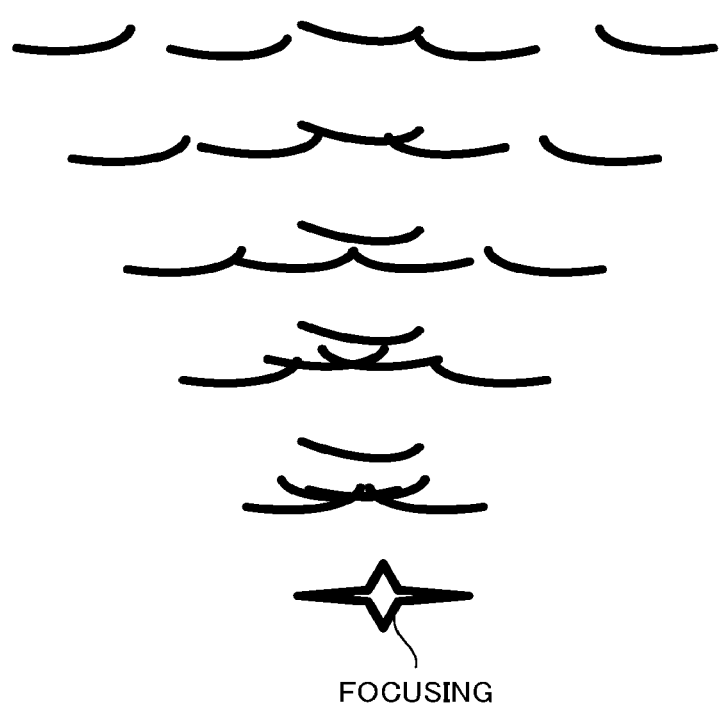

Consequently, a radiation state of the ultrasonic waves in the multilayer ultrasonic transducer 1 of the first embodiment is as illustrated in FIG. 2. In FIG. 2, the arrows X and the bars Y represent sound pressures, and the longer arrow X and the lower bar Y in the drawing indicate a higher sound pressure. In FIG. 2, the reference sign 9 denotes a backing material, which is provided for the purpose of attenuating the ultrasonic waves released to a rear surface opposite to an ultrasonic wave transmitting/receiving surface of the multilayer oscillator 3 and damping residual vibration of the multilayer oscillator 3 caused by pulse driving and the received wave. As the backing material, ferrite rubber, a porous ceramic material, and the like are often used. The sound pressure in the inner region A1 without the internal electrodes 5A, 5B is the lowest, the sound pressure in the outer peripheral regions A3 having a large number of the internal electrodes 5A, 5B is the highest, and the sound pressure in the intermediate regions A2 having an intermediate number of the internal electrodes 5A, 5B is between those in the inner region A1 and the outer peripheral regions A3. That is, the sound pressure becomes lower from the outer peripheral regions A3 toward the inner region A1, and the sound pressure distribution is gradient from the outer peripheral regions A3 toward the inner region A1.

As described above, due to the gradient arrangement of the internal electrodes 5, in the outer peripheral regions A3, the oscillators 2 expand more, resulting in a higher sound pressure. Owing to such a sound pressure distribution, an ultrasonic wave emitting surface in a convex shape (in FIG. 2, concave in terms of the downward direction/convex in terms of the upward direction) is formed. This makes it possible to focus the ultrasonic waves toward the inner side of the multilayer oscillator 3 (toward the inner peripheral region A1). This is the same principle as phased array. Therefore, in the multilayer ultrasonic transducer 1 of the first embodiment, it is possible to focus the radiated ultrasonic waves without using an acoustic lens or the like, enabling performance enhancement of the ultrasonic transducer 1.

Figure 3:
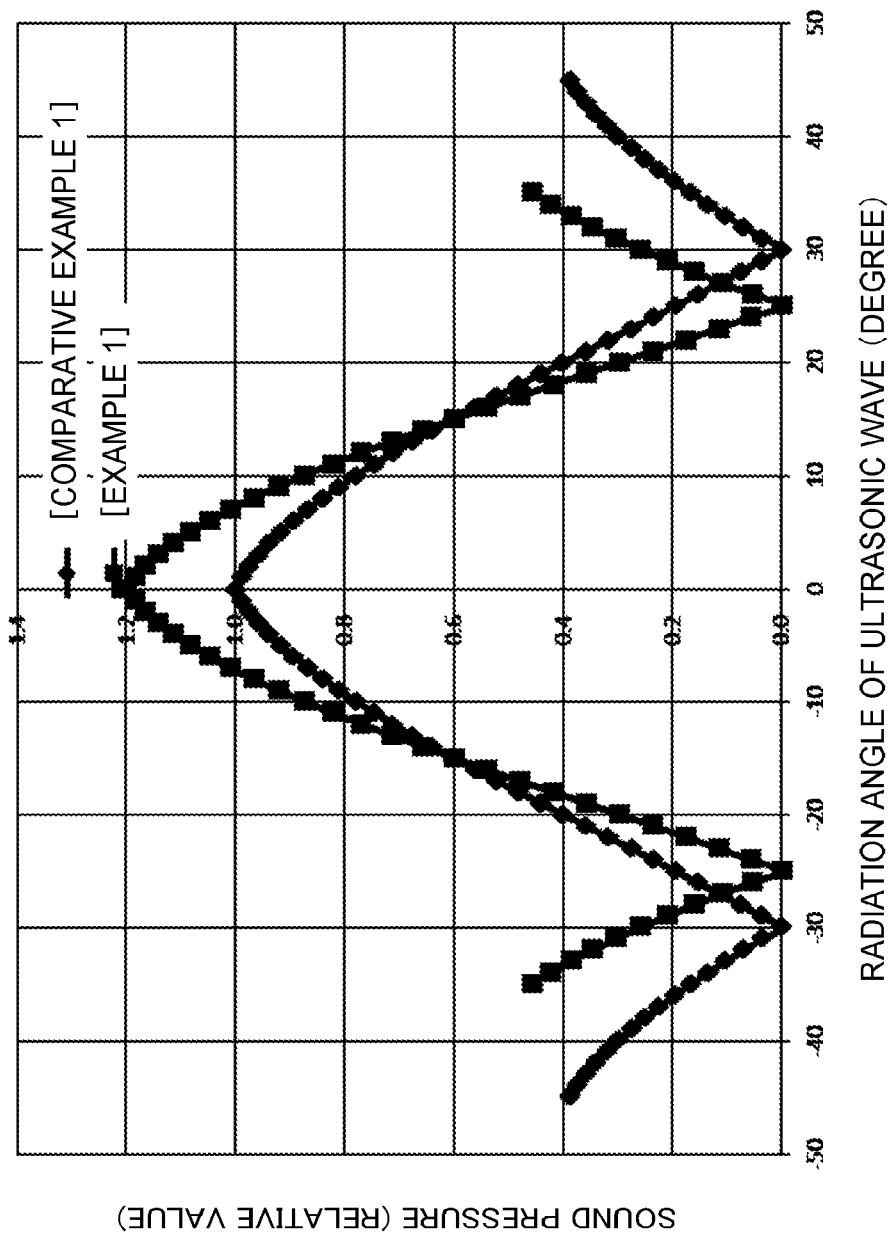
FIG. 3 is a chart showing the results of sound pressure measurement of an ultrasonic wave radiated from the multilayer ultrasonic transducer of the first embodiment.

FIG. 3 illustrates the results of sound pressure measurement when alternating voltages with the same frequency are applied to the multilayer ultrasonic transducer 1 of the first embodiment (example 1) and a multilayer ultrasonic transducer in which only external electrodes are formed on an oscillator equal in thickness to the oscillator of the multilayer ultrasonic transducer 1 (comparative example 1). In FIG. 3, the horizontal axis represents ultrasonic wave radiation angle and the vertical axis represents sound pressure. A sharper shape of a measured waveform of the sound pressure indicates a higher focusing property of the ultrasonic wave. It is seen from FIG. 3 that the waveform of the multilayer ultrasonic transducer of the example 1 has a sharper shape than the waveform of the multilayer ultrasonic transducer of the comparative example 1, and in addition, the sound pressure at the center portion is also higher in the example 1. It is seen from this that, according to the multilayer ultrasonic transducer 1 of the first embodiment, the radiated ultrasonic waves are focused.

Figure 4A:
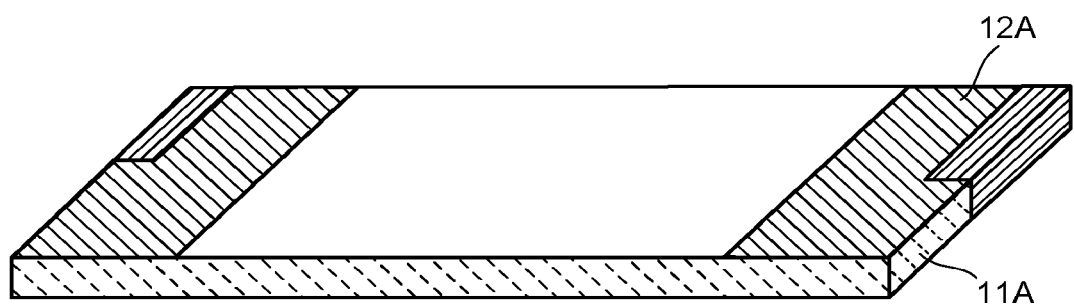
FIGS. 4A and 4B are views illustrating fabrication processes of the multilayer ultrasonic transducer illustrated in FIG. 1.
Figure 4B:
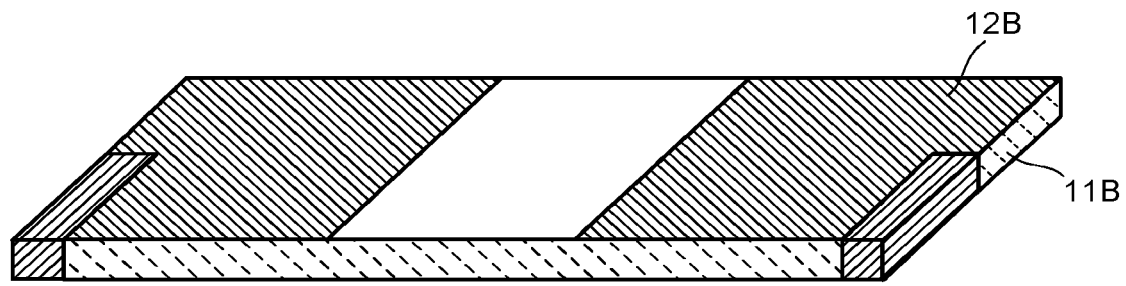

The multilayer ultrasonic transducer 1 of the first embodiment can be fabricated using, for example, a conventionally known simultaneous firing process of the oscillators 2, the external electrodes 4, and the internal electrodes 5. However, the fabrication process of the multilayer ultrasonic transducer 1 is not limited to the simultaneous firing process. For example, as illustrated in FIGS. 4A and 4B, a paste (electrode paste/conductive paste) 12 containing an electrode material is applied on a green sheet 11 of a piezoelectric material being a forming material of the oscillator 2. In FIG. 4A, a formation process of the oscillator 2A is illustrated, and an electrode paste 12A which will be the first internal electrode 5A is applied on a green sheet 11A which will be the oscillator 2A. In FIG. 4B, a formation process of the oscillator 2C is illustrated, and an electrode paste 12B which will be the first internal electrode 5A is applied on a green sheet 11B which will be the oscillator 2C.

The shape of the electrode paste 12 applied on the green sheet 11 is adjusted depending on the oscillators 2A to 2I in this manner. These green sheets 11 are stacked and press-joined to be integrated, and thereafter the stack of the green sheets 11 is simultaneously fired with the electrode pastes 12, whereby the multilayer oscillator 3 is fabricated. It is possible to obtain the green sheet 11 which will be the oscillator 2 by, for example, mixing a powder of the piezoelectric material such as lead zirconate titanate (PZT), lead titanate (PT), bismuth titanate (BNT), or barium titanate with a binder component, a solvent, and so on as required to prepare a slurry, and forming the slurry into a plate shape by a doctor blade method or the like. As the electrode paste 12, a conductive paste containing an element metal material such as palladium, gold, silver, copper, or nickel, or containing an alloy material including these metals is usable.

Incidentally, in the above-described fabrication process of the multilayer oscillator 3, since the simultaneous firing process of the oscillators 2 and the electrodes 4, 5 is employed, a ceramic-based material is used as the piezoelectric material, but in a case where a fabrication process other than the simultaneous firing process is employed, a piezoelectric material other than the ceramic-based material, for example, an organic piezoelectric material such as polyvinylidene fluoride may be used. In the case where the organic piezoelectric material is used, the fabrication is possible by bonding metal foils or metal films which will be the electrodes 4, 5 and sheets of the organic piezoelectric material while stacking them, as is done in a manufacturing process of a copper clad laminate or a prepreg. A method of manufacturing the multilayer ultrasonic transducer 1 of the first embodiment is not limited. The same applies to later-described other embodiments.

As described above, according to the multilayer ultrasonic transducer 1 of the first embodiment, it is possible to focus the ultrasonic waves without using an acoustic lens. Further, it is possible to obtain such an ultrasonic wave focusing effect only by arranging the internal electrodes 5 differently, enabling to achieve the focusing effect of the ultrasonic waves with a simple device structure. Therefore, it is possible to obtain the multilayer ultrasonic transducer 1 having the ultrasonic wave focusing effect with a simple device structure and at low cost, and in addition, to enhance the reliability of the multilayer ultrasonic transducer 1. Moreover, since interface reflection of the ultrasonic waves due to an increase in bonded interfaces does not occur and there is no influence of the ultrasonic wave attenuation in the lens as occurring when an acoustic lens is used, it is possible to inhibit the attenuation and so on of the ultrasonic waves. These factors enable to provide the multilayer ultrasonic transducer 1 having high reliability and excellent sensitivity and resolution at low cost.

Figure 5:
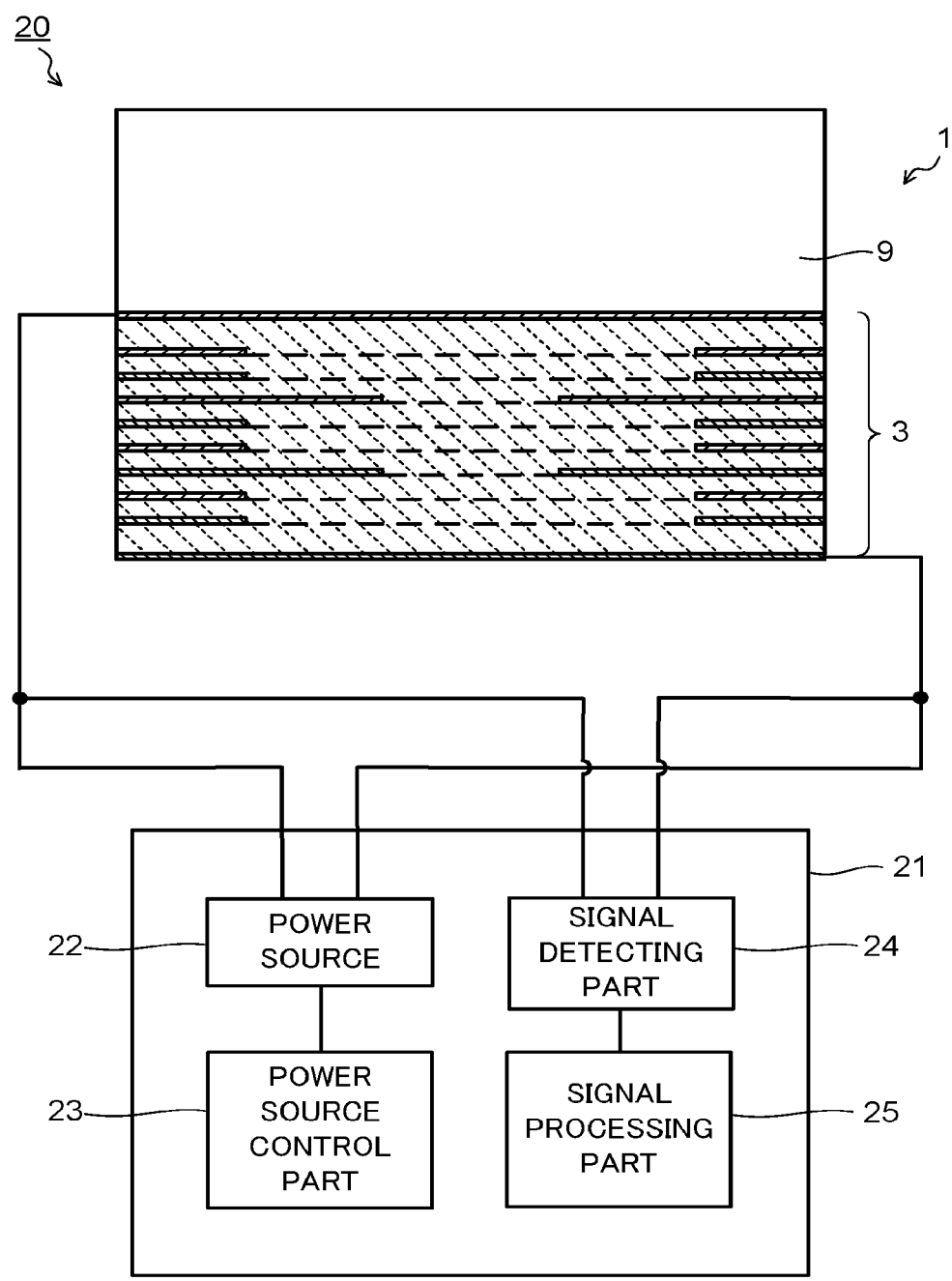
FIG. 5 is a view illustrating the structure of an ultrasonic inspection device using the multilayer ultrasonic transducer illustrated in FIG. 1.

An ultrasonic inspection device using the multilayer ultrasonic transducer 1 of the first embodiment will be described with reference to FIG. 5. The ultrasonic inspection device 20 illustrated in FIG. 5 includes the multilayer ultrasonic transducer 1 and a control unit 21. The control unit 2I includes a power source 22 which applies a voltage to the multilayer ultrasonic transducer 1, a power source control part 23 which controls the operation of the power source 22, a signal detecting part 24 which detects a reflected wave of the ultrasonic wave, and a signal processing part 25 which processes a detected signal to perform inspection processing.

In a case where a switching power source or the like is used as the power source 22, an oscillation frequency, a voltage, and so on of the power source 22 are controlled by the power source control part 23. When a desired alternating voltage is applied to the multilayer ultrasonic transducer 1 from the power source 22, the multilayer oscillator 3 transmits the focused ultrasonic wave from its ultrasonic wave emitting surface to a not-illustrated inspection target part. The ultrasonic wave transmitted from the multilayer ultrasonic transducer 1 is reflected on the inspection target part and its reflected wave is received by the multilayer ultrasonic transducer 1. The received reflected wave is detected by the signal detecting part 24 and is further subjected to the signal processing in the signal processing part 25. The signal processing part 24 amplifies a detection signal as required, and further applies necessary processing to the detection signal such as, for example, the imaging of the inspection target part, to enable the inspection of the inspection target part.

The ultrasonic inspection device 20 using the multilayer ultrasonic transducer 1 of the first embodiment is capable of high-sensitivity and high-resolution inspection of the inspection target part because the focused ultrasonic wave is transmitted from the multilayer ultrasonic transducer 1 to the inspection target part. This can enhance inspection accuracy and so on. The ultrasonic inspection device 20 of the embodiment is applicable to, for example, an ultrasonography device used for medical diagnosis, a non-destructive inspection device used in, for example, flaw detection, thickness inspection, and so on of industrial materials and devices, a probe which examines the state in ground, water, and the like, and so on. It should be noted that FIG. 5 illustrates a structure example using the single multilayer ultrasonic transducer 1, but the structure is not limited to this. The ultrasonic inspection device may include the multiple multilayer ultrasonic transducers 1 arranged in an array, for instance. Further, the multilayer ultrasonic transducer 1 may be used only as a transmitter of the ultrasonic wave and a separate receiver of the reflective wave may be provided.

Second Embodiment

Next, a multilayer ultrasonic transducer 30 of a second embodiment will be described with reference to FIG. 6 to FIG. 9. The number of layers of oscillators of a multilayer ultrasonic transducer is typically an odd number as shown in the first embodiment. In order for the number of layers of the oscillators to be an even number, some ingenuity needs to be exercised for the leading-out of internal electrodes. In a multilayer ultrasonic transducer 30A of the second embodiment illustrated in FIG. 6, a multilayer oscillator 3 has four layers of oscillators 2A, 2B, 2C, 2D stacked in sequence. On the uppermost layer of the multilayer oscillator 3, that is, on an upper surface of the oscillator 2D, a second external electrode 4B serving as a common electrode is provided.

The multilayer ultrasonic transducer 30A of the second embodiment has an inner region A1, intermediate regions A2, and outer peripheral regions A3, as in the first embodiment. The inner region A1 has no internal electrode 5, as in the first embodiment. On a portion of a lower surface of the oscillator 2A, corresponding to the inner region A1, a first external electrode 4A1 serving as an individual electrode is provided. Therefore, a voltage (electric field) is applied to four layers of the oscillators 2A to 2D present in the inner region A1 only from the first external electrode 4A1 and the second external electrode 4B. Seemingly, the inner region A1 has one layer of the oscillator 2 sandwiched between the external electrodes 4.

In each of the outer peripheral regions A3, a first internal electrode 5A is provided between the oscillator 2A and the oscillator 2B, and a second internal electrode 5B is provided between the oscillator 2C and the oscillator 2D. In the outer peripheral region A3, without any internal electrode between the oscillator 2B and the oscillator 2C, the oscillators 2B, 2C are integrated to function as one oscillator. On portions of the lower surface of the oscillator 2A, corresponding to the outer peripheral regions A3, first external electrodes 4A2 serving as individual electrodes are provided. Therefore, in each of the outer peripheral regions A3, a voltage (electric field) is applied to the oscillator 2A from the external electrode 4 and the internal electrode 5, and a voltage (electric field) is applied to the oscillators 2B, 2C from the internal electrodes 5A, 5B, and a voltage (electric field) is applied to the oscillator 2D from the external electrode 4B and the internal electrode 5B. Seemingly, the outer peripheral regions A3 each have three layers of the oscillators 2 sandwiched by the electrodes 4, 5.

In each of the intermediate regions A2, a second internal electrode 5B is provided between the oscillator 2B and the oscillator 2C. On portions of the lower surface of the oscillator 2A, corresponding to the intermediate regions A2, second external electrodes 4B1 serving as individual electrodes are provided. Therefore, in each of the intermediate regions A2, a voltage (electric field) is applied to the oscillators 2A, 2B from the external electrode 4B and the internal electrode 5B, and a voltage (electric field) is similarly applied to the oscillators 2C, 2D from the external electrode 4B and the internal electrode 5B. Seemingly, the intermediate regions A2 each have two layers of the oscillators 2 sandwiched by the electrodes 4, 5.

In this case, the thickness of each of the oscillators 2 sandwiched by the external electrodes 4, 5 in the intermediate regions A2 is about ½ of the thickness of the oscillator 2 in the inner region A1, and the thickness of each of the oscillators 2 sandwiched by the external electrodes 4, 5 in the outer peripheral regions A3 is about ⅓ of the thickness of the oscillator 2 in the inner region A1. The thickness of the oscillators 2B, 2C is set to an about ½ of the thickness of the oscillators 2A, 2D. Further, for the external electrical connection of the internal electrodes 5B disposed in the intermediate regions A2, these internal electrodes 5B are connected to the respective second internal electrodes 5B via through holes provided in the oscillator 2C. Similarly, the second external electrodes 4B1 are connected to the respective first internal electrodes 5A via through holes provided in the oscillator 2A.

As described above, the leading-out of the internal electrodes 5 is made possible by the electrical connection between the internal electrodes 5 or between the external electrode 4 and the internal electrode 5 via the through holes provided in the oscillators, and at the same time, the number of the oscillators 2 can be an even number, with the number of the oscillators 2 sandwiched by the electrodes 4, 5 in the inner region 1, the intermediate regions A2, and the outer peripheral regions A3 being set to, for example, one, two, and three respectively. Incidentally, in the multilayer oscillator 3 illustrated in FIG. 6 as well, the first external electrodes 4A and the second internal electrodes 5B are connected to a first connection terminal (not illustrated in FIG. 6) and the second external electrodes 4B and the first internal electrodes 5A are connected to a second connection terminal (not illustrated in FIG. 6), as in the first embodiment. With such a connection structure, electric fields in opposite directions are applied to adjacent ones of the oscillators 2A, 2B+2C, and 2D, as in the first embodiment. Further, as in the first embodiment, since the internal electrodes 5 are arranged such that the number of layers of the internal electrodes 5 gradiently increases from the inner region A1 toward the outer peripheral regions A3, ultrasonic waves are focused inward.

Figure 6:
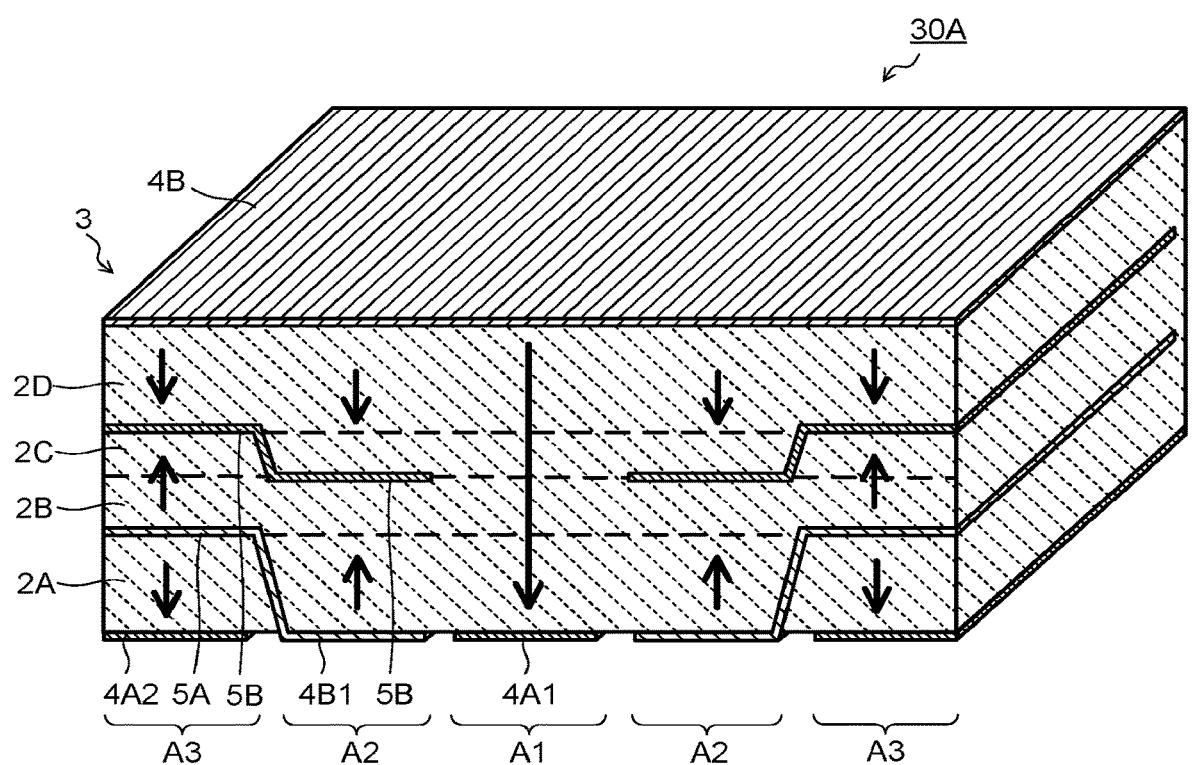
FIG. 6 is a perspective view illustrating a first example of a multilayer ultrasonic transducer of a second embodiment.
Figure 7:
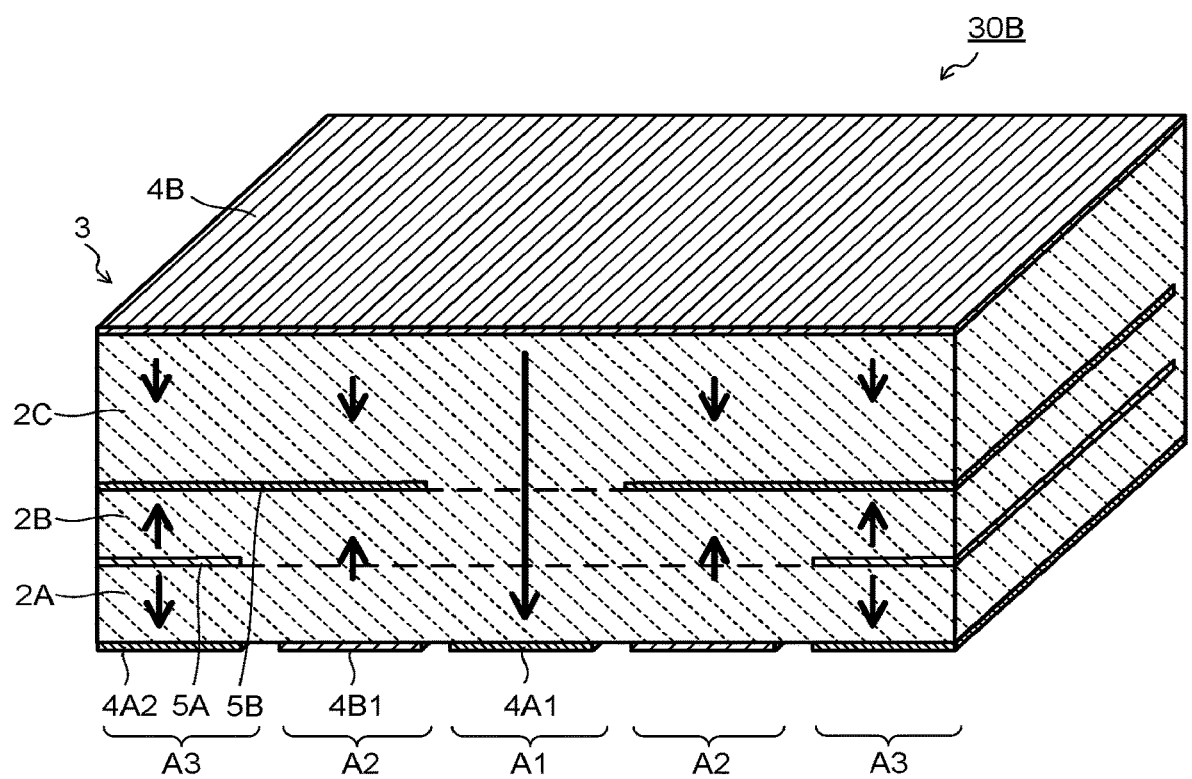
FIG. 7 is a perspective view illustrating a second example of the multilayer ultrasonic transducer of the second embodiment.
Figure 8:
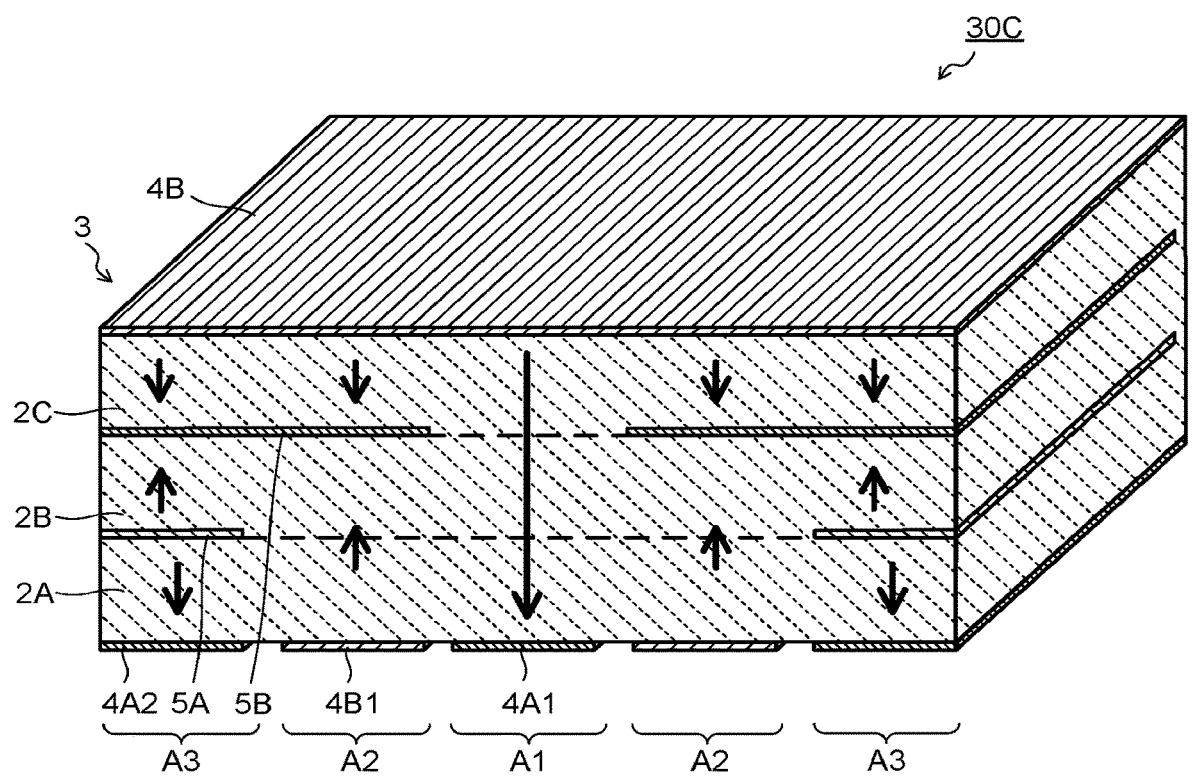
FIG. 8 is a perspective view illustrating a third example of the multilayer ultrasonic transducer of the second embodiment.

In FIG. 6, the external leading-out of the internal electrodes 5 is worked out using the through holes, but by designing the thickness of the oscillators 2A to 2D or the arrangement of the internal electrodes 5 as illustrated in FIG. 7 and FIG. 8, it is also possible to increase the number of layers of the internal electrodes 5 from the inner region A1 toward the outer peripheral regions A3 while enabling the external leading-out of the internal electrodes 5. FIG. 7 illustrates a structure in which the oscillators 2A to 2D do not have a uniform thickness and the external leading-out of the internal electrodes 5 is enabled not via the through holes. FIG. 8 illustrates a structure in which the oscillators 2A to 2D have a uniform thickness and the external leading-out of the internal electrodes 5 is enabled not via the through holes.

A multilayer ultrasonic transducer 30B illustrated in FIG. 7 has three layers of oscillators 2A to 2C. The oscillators 2A, 2B each have an about ¼ thickness of the whole thickness, and the oscillator 2C has an about ½ thickness of the whole thickness. There is no internal electrode 5 in an inner region A1, as in FIG. 6. A first external electrode 4A1 serving as an individual electrode is provided on a portion, of a lower surface of the oscillator 2A, corresponding to the inner region A1. Therefore, a voltage (electric field) is applied to three layers of the oscillators 2A to 2C present in the inner region A1 only from the first external electrode 4A1 and a second external electrode 4B. Seemingly, the inner region A1 has one layer of the oscillator 2 sandwiched between the external electrodes 4A, 4B.

In each of outer peripheral regions A3, a first internal electrode 5A is provided between the oscillator 2A and the oscillator 2B. These first internal electrodes 5A are provided only in the outer peripheral regions A3. Further, second internal electrodes 5B are each provided between the oscillator 2B and the oscillator 2C. These second internal electrodes 5B extend up to intermediate regions A2. First external electrodes 4A2 serving as individual electrodes are provided on portions of the lower surface of the oscillator 2A, corresponding to the outer peripheral regions A2. Therefore, in each of the outer peripheral regions A3, a voltage (electric field) is applied to the oscillator 2A from the external electrode 4 and the internal electrode 5, a voltage (electric field) is applied to the oscillator 2B from the internal electrodes 5A, 5B, and a voltage (electric field) is applied to the oscillator 2C from the external electrode 4 and the internal electrode 5. Seemingly, the outer peripheral regions A3 each have three layers of the oscillators 2 sandwiched by the electrodes 4, 5.

In each of the intermediate regions A2, the second internal electrode 5B is provided between the oscillator 2B and the oscillator 2C. Second external electrodes 4B1 serving as individual electrodes are provided on portions, of the lower surface of the oscillator 2A, corresponding to the intermediate regions A2. In the intermediate regions A2, with no internal electrode 5 between the oscillator 2A and the oscillator 2B, the oscillators 2A, 2B are integrated to function as one oscillator. Therefore, in each of the intermediate regions A2, a voltage (electric field) is applied to the oscillators 2A, 2B from the external electrode 4 and the internal electrode 5, and similarly, a voltage (electric field) is applied to the oscillator 2C from the external electrode 4 and the internal electrode 5. Seemingly, the intermediate regions A2 each have two layers of the oscillators 2 sandwiched by the electrodes 4, 5.

As described above, the arrangement of the internal electrodes 5 may be asymmetric in terms of the up and down direction (stacking direction). In such a case as well, by arranging the internal electrodes 5 such that the number of layers of the internal electrodes 5 gradiently increases from the inner region A1 toward the outer peripheral regions A3, it is possible to focus ultrasonic waves inward. In FIG. 7, the thicknesses of the oscillators 2A to 2C are set such that the thickness of each of the oscillators 2 in the intermediate regions A2 becomes about ½ of the thickness of the oscillator 2 in the inner region A1. In this case, in each of the outer peripheral regions A3, the upper oscillator 2 differs in thickness from the lower oscillators 2. On the other hand, as illustrated in a multilayer ultrasonic transducer 30C in FIG. 8, the oscillators 2A to 2C each may have an about ⅓ thickness of the whole thickness and, in the intermediate regions A2, the upper and lower oscillators 2 may be different in thickness.

Figure 9:
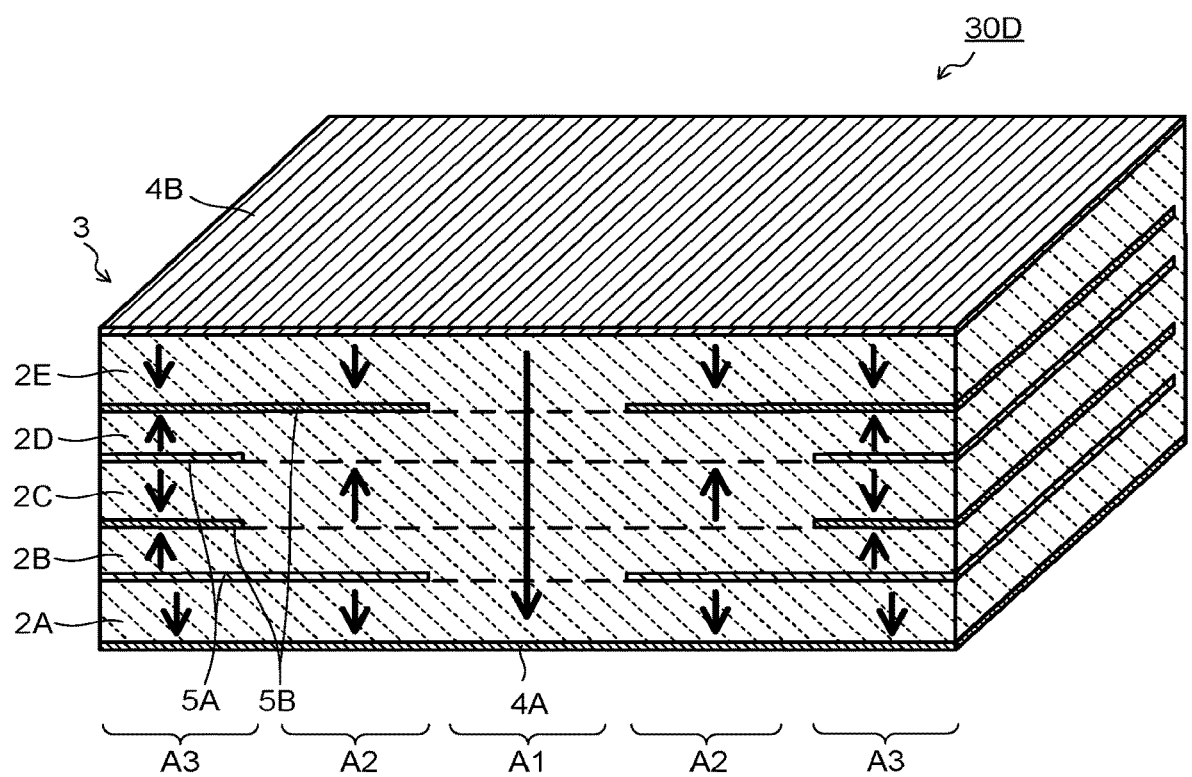
FIG. 9 is a perspective view illustrating a fourth example of the multilayer ultrasonic transducer of the second embodiment.

FIG. 9 illustrates a multilayer ultrasonic transducer 30D having an external electrode 4A as a common electrode. Seemingly, an inner region A1 has one layer of an oscillator 2 sandwiched between the external electrodes 4. Seemingly, intermediate regions A2 each have three layers of the oscillators 2 sandwiched by electrodes 4, 5. Seemingly, outer peripheral regions A3 each have five layers of the oscillators 2 sandwiched by the electrodes 4, 5. In the intermediate regions A2, without any internal electrode 5 between each two of the oscillators 2B, 2C, 2D, the oscillators 2B, 2C, 2D are integrated to function as one oscillator. Therefore, the integrated body of the oscillators 2B, 2C, 2D is different in thickness from the oscillator 2A and the oscillator 2E. The multiple oscillators 2 present in the same region may be thus different in thickness. In such a case as well, it is possible to focus ultrasonic waves inward by arranging the internal electrodes 5 such that the number of layers of the internal electrodes 5 gradiently increases from the inner region A1 toward the outer peripheral regions A3.

Third Embodiment

Next, a multilayer ultrasonic transducer 40 of a third embodiment will be described with reference to FIG. 10 and FIG. 11. Here, the first and second embodiments describe the structure for focusing the ultrasonic waves toward the inner region (central region) A1 from the outer peripheral regions A3 which include the two opposed outer sides of the rectangular multilayer oscillator 3 respectively, but the focusing direction of the ultrasonic waves is not limited to this. The multilayer ultrasonic transducer 40 of the third embodiment illustrated in FIG. 10 focuses ultrasonic waves from a first outer peripheral region A31 toward a second outer peripheral region A32, the former and the latter including one outer side and the other outer side, respectively, out of two opposed outer sides of a rectangular multilayer oscillator 3. That is, this structure is for oblique focusing. Incidentally, the structure illustrated in FIG. 10 also partly has a region where the number of layers of internal electrodes gradiently increases from an inner region toward the outer peripheral region.

Figure 10:
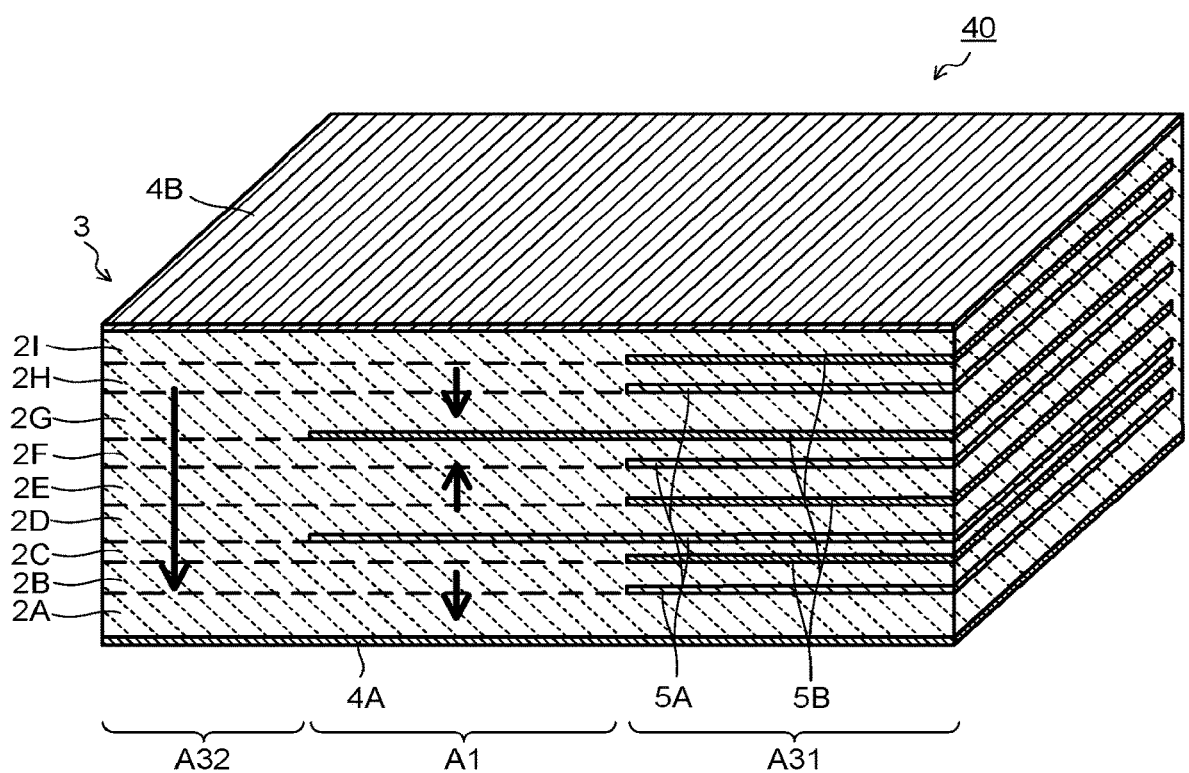
FIG. 10 is a perspective view illustrating a multilayer ultrasonic transducer of a third embodiment.

In the multilayer ultrasonic transducer 40 illustrated in FIG. 10, the multilayer oscillator 3 has nine layers of oscillators 2A, 2B ... 2I stacked in sequence. On a lower surface of the oscillator 2A out of the two oscillators 2A, 2I disposed in the outermost layers of the multilayer oscillator 3, a first external electrode 4A is provided, and on an upper surface of the oscillator 2I, a second external electrode 4B is provided. The external electrodes 4A, 4B function as common electrodes. In the multilayer ultrasonic transducer 40 of the third embodiment, internal electrodes 5 are provided inside the multilayer oscillator 3 and a formation region of the internal electrode 5 differs among interlayer spaces of the oscillators 2A to 2I, as in the first embodiment.

In FIG. 10, a region A1 is an inner region of the multilayer oscillator 3, a region A31 is the first outer peripheral region including one outer side out of the two opposed outer sides of the multilayer oscillator 3, and a region A32 is the second outer peripheral region including the other outer side out of the two opposed outer sides of the multilayer oscillator 3. In the first outer peripheral region A31, first and second internal electrodes 5A, 5B are provided in sequence, each between two of nine layers of the oscillators 2A to 2I. Therefore, in the first outer peripheral region A31, a voltage (electric field) is applied to the oscillators 2 from the external electrodes 4 and the internal electrodes 5. Further, the second outer peripheral region A32 has nine layers of the oscillators 2 sandwiched by the electrodes 4, 5.

In the inner region A1, the internal electrodes 5A, 5B extending from the first outer peripheral region A31 are provided between the oscillator 2C and the oscillator 2D and between the oscillator 2F and the oscillator 2G respectively. In the inner region A1, a voltage (electric field) is applied to the oscillators 2 each consisting of three layers, from the external electrodes 4 and the internal electrodes 5. Seemingly, the inner region A1 has three layers of the oscillators 2 sandwiched by the electrodes 4, 5. In the second outer peripheral region A32, the internal electrodes 5A, 5B are not provided. Therefore, a voltage (electric field) is applied to nine layers of the oscillators 2A to 2I present in the second outer peripheral region A32, only from the first external electrode 4A and the second external electrode 4B. Seemingly, the second outer peripheral region A32 has one layer of the oscillator 2 sandwiched between the external electrode 4A and the external electrode 4B. Incidentally, electric fields in opposite directions are applied to adjacent ones of the oscillators 2A to 2I to cause the displacement of the oscillators 2A to 2I, as in the first embodiment.

As described above, in the multilayer ultrasonic transducer 40 of the third embodiment, the internal electrodes 5 of the multilayer oscillator 3 are arranged such that the number of layers of the internal electrodes 5 in the stacking direction of the oscillators 2 gradiently increases from the second outer peripheral region A32 toward the first outer peripheral region A31. In the multilayer ultrasonic transducer 40 illustrated in FIG. 10, the number of layers of the internal electrodes 5 gradiently increases from the second outer peripheral region A32 toward the outer peripheral region A31 in order of 0, 2, and 8. As in the first embodiment, the gradient arrangement of the internal electrodes 5 causes differences in driving electric field, displacement amount, and driving power.

Figure 11:
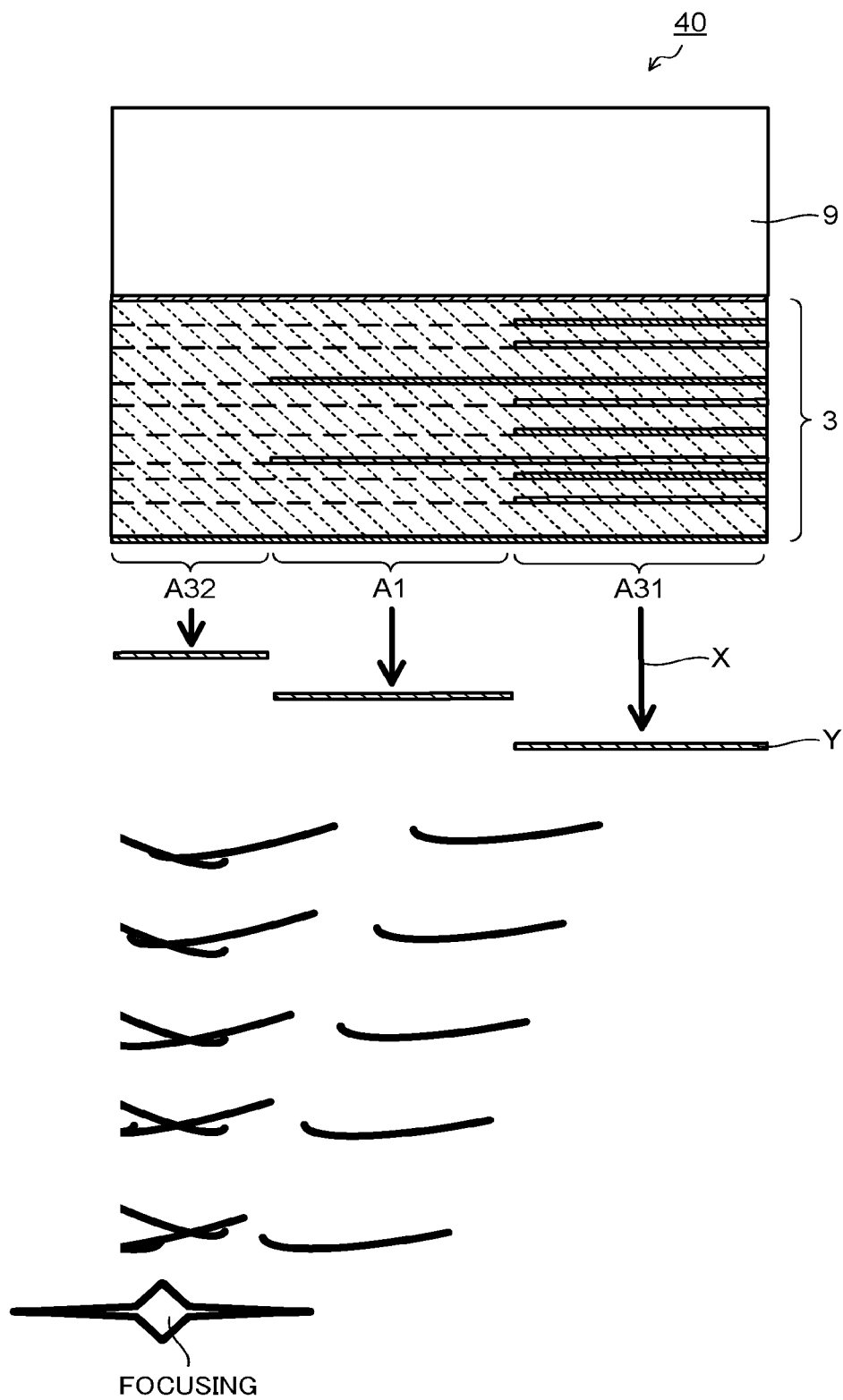
FIG. 11 is a view illustrating a state of ultrasonic waves radiated from the multilayer ultrasonic transducer illustrated in FIG. 10.

Consequently, a radiation state of the ultrasonic waves in the multilayer ultrasonic transducer 40 of the third embodiment is as illustrated in FIG. 11. In the multilayer ultrasonic transducer 40, a sound pressure in the second outer peripheral region A32 without the internal electrodes 5A, 5B is the lowest, and a sound pressure in the first outer peripheral region A31 with a large number of the internal electrodes 5A, 5B is the highest. That is, the sound pressure decreases from the first outer peripheral region A31 toward the second outer peripheral region A32, and a sound pressure distribution is gradient from the first outer peripheral region A31 toward the second outer peripheral region A32.

As described above, due to the gradient arrangement of the internal electrodes 5, the oscillators 2 in the first outer peripheral region A31 expand more, resulting in a higher sound pressure. With such a sound pressure distribution, an ultrasonic wave emitting surface has a semi-convex shape. This enables the oblique focusing of the ultrasonic waves from the first outer peripheral region A31 toward the second outer peripheral region A32. Therefore, in the multilayer ultrasonic transducer 40 of the third embodiment, it is possible to focus the radiated ultrasonic waves in a fixed direction without using an acoustic lens or the like to enhance performance, application range, applicability, and so on of the ultrasonic transducer 40.

In the above-described embodiments, the ultrasonic transducer using the multilayer oscillator having a rectangular shape is described, but the shape of the multilayer oscillator is not limited to this. The shape of the multilayer oscillator may be a quadrangle other than a rectangle, a polygon other than a quadrangle, a circle, an ellipse, or the like. A structure conforming to the above-described embodiments is applied to a polygonal oscillator. In a case where the oscillator is circular, elliptical, or the like, the internal electrodes are arranged such that the number of layers of the internal electrodes gradiently increases from a central region toward an outer peripheral region including an outer peripheral curve of the circle or the ellipse. In an ultrasonic transducer including the oscillator having such a structure, the focusing of ultrasonic waves is also possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multilayer ultrasonic transducer comprising:
   a plurality of stacked oscillator layers;
   external electrode layers disposed on outer exposed surfaces of two oscillator layers positioned in outermost layers out of the stacked oscillator layers; and
   a plurality of internal electrode layers each disposed between two of the stacked oscillator layers,
   wherein there are provided electrode regions in which the plurality of internal electrode layers are arranged such that the number of the internal electrode layers in a direction in which the oscillator layers are stacked increases from an region toward an outer peripheral region of the stacked oscillator layers, and ultrasonic waves emitted from the stacked oscillator layers are focused toward at least the inner region, and
   the stacked oscillator layers each have a quadrangular outer shape, and the plurality of internal electrode layers are arranged such that the number of the internal electrode layers, gradiently increases from one outer side toward the other outer side out of at least two opposed outer sides of the quadrangular outer shape.

2. The transducer according to claim 1, wherein the electrode regions different in the number of the internal electrode layers are driven by different electric fields.

3. An ultrasonic inspection device comprising:
   the multilayer ultrasonic transducer according to claim 1; and
   a control unit which causes the multilayer ultrasonic transducer to transmit an ultrasonic wave to an inspection target and receive a reflected wave from the inspection target, thereby inspecting a state of the inspection target based on the reflected wave.

* * * * *